(12) United States Patent
Schumacher

(10) Patent No.: US 9,537,262 B2
(45) Date of Patent: Jan. 3, 2017

(54) PRINTED CIRCUIT BOARDS FOR COMMUNICATIONS CONNECTORS HAVING OPENINGS THAT IMPROVE RETURN LOSS AND/OR INSERTION LOSS PERFORMANCE AND RELATED CONNECTORS AND METHODS

(71) Applicant: CommScope, Inc. of North Carolina, Hickory, NC (US)

(72) Inventor: Richard A. Schumacher, Dallas, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 0 days.

(21) Appl. No.: 15/162,875

(22) Filed: May 24, 2016

(65) Prior Publication Data

US 2016/0268740 A1 Sep. 15, 2016

Related U.S. Application Data

(63) Continuation of application No. 14/166,897, filed on Jan. 29, 2014, now Pat. No. 9,380,710.

(51) Int. Cl.
*H01R 13/6477* (2011.01)
*H01R 24/64* (2011.01)
*H01R 4/02* (2006.01)
*H01R 13/6464* (2011.01)
*H01R 13/6461* (2011.01)

(52) U.S. Cl.
CPC .......... *H01R 13/6477* (2013.01); *H01R 4/023* (2013.01); *H01R 13/6461* (2013.01); *H01R 13/6464* (2013.01); *H01R 24/64* (2013.01)

(58) Field of Classification Search
CPC . H01R 4/023; H01R 13/6461; H01R 13/6464; H01R 13/6466; H01R 13/6469; H01R 13/6477; H01R 13/6625; H01R 13/6658; H01R 23/005; H01R 23/025; H01R 24/64; H01R 2201/04; H05K 1/024; H05K 1/025; H05K 1/0228; H05K 1/0298; H05K 1/165; H05K 3/10; H05K 3/403; H05K 2201/0187; H05K 2201/09163; H05K 2201/10189; H05K 2201/1031; H05K 2201/10318; H05K 2201/1034; Y02P 70/611; Y02T 29/49155
(Continued)

(56) References Cited

U.S. PATENT DOCUMENTS 5,154,621 A 10/1992 Legrady
5,326,284 A 7/1994 Bohbot
(Continued)

*Primary Examiner* — Tulsidas C Patel
*Assistant Examiner* — Travis Chambers
(74) *Attorney, Agent, or Firm* — Myers Bigel, P.A.

(57) ABSTRACT

Printed circuit boards for communications connectors are provided that include a dielectric substrate formed of a first insulative material having a first dielectric constant. First and second pairs of input terminals and first and second pairs of output terminals are provided on the dielectric substrate. A first differential transmission line electrically connect the first pair of input terminals to the first pair of output terminals, and a second differential transmission line electrically connect the second pair of input terminals to the second pair of output terminals. The dielectric substrate includes an opening that is positioned between the conductive paths of the first differential transmission line, the opening containing a second insulative material having a second dielectric constant.

16 Claims, 6 Drawing Sheets

(58) Field of Classification Search
USPC .... 439/676, 620.09, 620.11, 620.21–620.23, 439/941
See application file for complete search history.

(56) References Cited

U.S. PATENT DOCUMENTS

| | | | |
|---|---|---|---|
| 5,451,169 | A | 9/1995 | Corbett |
| 7,281,957 | B2 | 10/2007 | Caveney |
| 7,364,470 | B2* | 4/2008 | Hashim ................ H05K 1/0228 439/676 |
| 7,722,401 | B2 | 5/2010 | Kirk |
| 7,731,537 | B2 | 6/2010 | Amleshi |
| 7,789,705 | B2 | 9/2010 | Morgan |
| 7,874,849 | B2 | 1/2011 | Sticker |
| 7,896,692 | B2 | 3/2011 | Gibson et al. |
| 8,167,661 | B2 | 5/2012 | Straka et al. |
| 8,262,412 | B1 | 9/2012 | Minnick |
| 8,597,047 | B2 | 12/2013 | Soubh |
| 8,771,016 | B2 | 7/2014 | Atkinson |
| 8,771,023 | B2 | 7/2014 | De Bruijn |
| 8,814,595 | B2 | 8/2014 | Cohen |
| 2004/0018757 | A1 | 1/2004 | Lang |
| 2006/0185890 | A1 | 8/2006 | Robinson |
| 2010/0136835 | A1 | 6/2010 | Hashim |
| 2010/0291795 | A1 | 11/2010 | Gibson |
| 2010/0317230 | A1 | 12/2010 | Larsen |
| 2011/0195607 | A1 | 8/2011 | De Bruijn |
| 2011/0263158 | A1 | 10/2011 | Nishikata |
| 2013/0098671 | A1 | 4/2013 | Thurairajaratnam |
| 2015/0214667 | A1 | 7/2015 | Chen |

\* cited by examiner

PRINTED CIRCUIT BOARDS FOR COMMUNICATIONS CONNECTORS HAVING OPENINGS THAT IMPROVE RETURN LOSS AND/OR INSERTION LOSS PERFORMANCE AND RELATED CONNECTORS AND METHODS

CROSS-REFERENCE TO RELATED APPLICATION

The present application claims priority under 35 U.S.C. §120 as a continuation of U.S. patent application Ser. No. 14/166,897, filed Jan. 29, 2014, now U.S. Pat. No. 9,380,710, the entire contents of which is incorporated herein by reference as if set forth in its entirety.

FIELD OF THE INVENTION

The present invention relates generally to communications connectors and, more particularly, to communications connectors having improved return loss and/or insertion loss performance.

BACKGROUND

Many hardwired communications systems use plug and jack connectors to connect a communications cable to another communications cable or to a piece of equipment such as a computer, printer, server, switch or patch panel. By way of example, high speed Ethernet communications systems routinely use such plug and jack connectors to connect computers, printers and other devices to local area networks and/or to external networks such as the Internet. FIG. 1 depicts a highly simplified example of such a hardwired high speed communications system that illustrates how plug and jack connectors may be used to interconnect a computer 11 to, for example, a network server 20.

As shown in FIG. 1, the computer 11 is connected by a cable 12 to a communications jack 15 that is mounted in a wall plate 19. The cable 12 is a patch cord that includes a communications plug 13, 14 at each end thereof. Typically, the cable 12 includes eight insulated conductors, and the communications plug 14 and the communications jack 15 will typically each have eight contacts. As shown in FIG. 1, plug 14 is inserted into an opening or "plug aperture" 16 in the front side of the communications jack 15 so that the contacts or "plug blades" of communications plug 14 mate with respective contacts of the communications jack 15. The communications jack 15 includes a wire connection assembly 17 at the back end thereof that receives eight conductors from a second cable 18 that are individually pressed into slots in the wire connection assembly 17 to establish mechanical and electrical connections between each conductor of the second cable 18 and a respective one of a plurality of conductive paths through the communications jack 15. The other end of the second cable 18 is connected to a network server 20 which may be located, for example, in a telecommunications closet of a commercial office building. Communications plug 13 similarly is inserted into the plug aperture of a second communications jack (not pictured in FIG. 1) that is provided in the back of the computer 11. Thus, the patch cord 12, the cable 18 and the communications jack 15 provide a plurality of electrical paths between the computer 11 and the network server 20. These electrical paths may be used to communicate electrical information signals between the computer 11 and the network server 20. Most modern conductive-wire based communications systems of the type depicted in FIG. 1 use industry standardized plugs and jacks that conform the "RJ-45" plug and jack specifications.

When an information signal is transmitted over a conductor such as an insulated copper wire in a communications cable, electrical noise from external sources may be picked up by the conductor, degrading the quality of the information signal. In order to counteract such noise sources, the information signals in the above-described communications systems are typically transmitted between devices over a pair of conductors (hereinafter a "differential pair" or simply a "pair") rather than over a single conductor. The two conductors of each differential pair are twisted tightly together in the communications cables and patch cords so that the eight conductors are arranged as four twisted differential pairs of conductors that form four differential transmission lines. The signals transmitted on each conductor of a differential pair have equal magnitudes, but opposite phases, and the information signal is embedded as the voltage difference between the signals carried on the two conductors of the pair. When the information signal is transmitted over a twisted differential pair of conductors, each conductor in the differential pair often picks up approximately the same amount of noise from these external sources. Because approximately an equal amount of noise is added to the signals carried by both conductors of the twisted differential pair, the information signal is typically not disturbed, as the information signal is extracted by taking the difference of the signals carried on the two conductors of the differential pair, and this subtraction process may mostly cancel out the noise signal.

Unfortunately, the proximities of the conductors and contacting structures within each plug jack connection (e.g., where plug 14 mates with jack 15) can produce capacitive and/or inductive couplings. These capacitive and inductive couplings in the connectors (and similar couplings that may arise in the cabling) give rise to another type of noise that is known as "crosstalk." "Crosstalk" is typically defined as the unwanted signal energy that is capacitively and/or inductively coupled onto the conductors of a first "victim" differential pair from a signal that is transmitted over a second "disturbing" differential pair.

While methods are available that can significantly reduce the effects of crosstalk within communications cable segments, the communications connector configurations that were adopted years ago—and which still are in effect in order to maintain backwards compatibility—generally did not maintain the arrangement and geometry of the conductors of each differential pair so as to minimize the crosstalk coupling between the differential pairs in the connector hardware. For example, pursuant to the ANSI/TIA-568-C.2 standard approved Aug. 11, 2009 by the Telecommunications Industry Association (also known as the Category 6a standard), the eight plug blades, and hence the plug blade contact regions of the eight jack contacts 1-8, must be aligned in a row. FIG. 2 shows the positions and pair assignments of the plug contact regions of the eight jack contacts 1-8. As is apparent from FIG. 2, this arrangement of the eight jack contacts 1-8 will result in unequal coupling between the differential pairs, and hence crosstalk is introduced.

As the operating frequencies of communications systems has increased, crosstalk in the plug and jack connectors has became a more significant problem. The crosstalk that is introduced in an RJ-45 plug and the additional crosstalk that is generated in the mating region of an RJ-45 jack is typically referred to as "offending crosstalk." While offending crosstalk is generated between all four differential pairs in an RJ-45 plug, the crosstalk is particularly problematic between pairs 1 and 3 due to the "split pair" arrangement, and is also significant between pair 2 and pair 3 and between pair 3 and pair 4.

To address the crosstalk problem, communications jacks were developed that included so-called "compensating crosstalk circuits" that introduce compensating crosstalk that was used to cancel much of the offending crosstalk that is introduced in the plug jack mating region as a result of the industry-standardized connector configurations. In order to ensure that plugs and jacks manufactured by different vendors would operate properly, industry standards were developed that, among other things, tightly specified the amount of offending crosstalk that would exist between each of the differential pairs in an RJ-45 plug. By standardizing this parameter, manufacturers could design their RJ-45 jacks to cancel the amounts of crosstalk specified in the industry standards using various crosstalk compensation circuits that are known to those of skill in the art.

SUMMARY

Pursuant to embodiments of the present invention, printed circuit boards for communications connectors are provided that include a dielectric substrate formed of a first insulative material having a first dielectric constant. First and second pairs of input terminals are provided on the dielectric substrate, as are first and second pairs of output terminals. A first pair of conductive paths on the dielectric substrate that are arranged as a first differential transmission line electrically connect the first pair of input terminals to the first pair of output terminals, and a second pair of conductive paths on the dielectric substrate that are arranged as a second differential transmission line electrically connect the second pair of input terminals to the second pair of output terminals. The dielectric substrate includes an opening that is positioned between the conductive paths of the first pair of conductive paths, the opening containing a second insulative material having a second dielectric constant that is different than the first dielectric constant.

In some embodiments, the second dielectric constant may be lower than the first dielectric constant. The second insulative material may be air. The opening may be an air-filled opening that extends from a top surface of the dielectric substrate to a bottom surface of the dielectric substrate. The opening may also be positioned between the conductive paths of the second pair of conductive paths.

In some embodiments, the dielectric substrate may be a multi-layer dielectric substrate having at least a first dielectric layer and a second dielectric layer, and the printed circuit board may further include a conductive image plane between the first dielectric layer and the second dielectric layer. The printed circuit board may also include third and fourth pairs of input terminals and third and fourth pairs of output terminals on the dielectric substrate. A third pair of conductive paths on the dielectric substrate that are arranged as a third differential transmission line electrically connect the third pair of input terminals to the third pair of output terminals, and a fourth pair of conductive paths on the dielectric substrate that are arranged as a fourth differential transmission line electrically connect the fourth pair of input terminals to the fourth pair of output terminals. In these embodiments the printed circuit board may be combined with four pairs of input contacts that are electrically connected to the first through fourth pair of input terminals, respectively, four pairs of output contacts that are electrically connected to the first through fourth pair of output terminals, respectively, and a housing that at least partially encloses the printed circuit board to provide an RJ-45 communications connector. In such embodiments, the contact portions of the four pairs of input contacts may be arranged in a row, and the contact portions of the first pair of input contacts may be between contact portions of the second pair of input contacts.

In some embodiments, the printed circuit board may further include a crosstalk circuit that injects crosstalk onto a first section of a first conductive path of the first differential transmission line. The air-filled opening may be positioned immediately adjacent the first section of the first conductive path. The crosstalk circuit may be an inductive crosstalk circuit. The crosstalk circuit may decrease the impedance of the first section of the first differential transmission line, and the air-filled opening may increase the impedance of the first section of the first differential transmission line without materially changing the amount of crosstalk injected by the crosstalk circuit.

Pursuant to further embodiments of the present invention, communications connectors are provided that include a housing and a printed circuit board that is mounted at least partly within the housing. The printed circuit board includes a planar dielectric substrate, a plurality of pairs of input terminals, a plurality of pairs of output terminals, and a plurality of differential transmission lines that each connect a respective one of the pairs of input terminals to a respective one of the pairs of output terminals. The connector further includes a plurality of pairs of input contacts that are electrically connected to respective ones of the pairs of input terminals and a plurality of pairs of output contacts that are electrically connected to respective ones of the pairs of output terminals. The planar dielectric substrate includes an air-filled opening that is positioned to increase the impedance of at least one of the plurality of differential transmission lines.

In some embodiments, the air-filled opening may be an opening that extends from a top face of the printed circuit board to a bottom face of the printed circuit board. The air-filled opening may be positioned between a first conductive path and a second conductive path of a first of the differential transmission lines. The air-filled opening may be positioned between a first conductive path and a second conductive path of a second of the differential transmission lines. The printed circuit board may further include a crosstalk circuit that injects crosstalk onto a first section of a first conductive path of the first differential transmission line, and the air-filled opening may be positioned immediately adjacent the first section of the first conductive path. The crosstalk circuit may be an inductive crosstalk circuit. The communications connector may be an RJ-45 plug that is connected to a communications cable to provide a patch cord.

Pursuant to further embodiments of the present invention, methods of manufacturing a printed circuit board for a communications connector are provided in which a plurality of input terminals, a plurality of output terminals and a plurality of conductive paths are formed on a planar dielectric substrate. The planar dielectric substrate is formed of a first material having a first dielectric constant. Each of the conductive paths electrically connects a respective one of the input terminals to a respective one of the output terminals, the conductive paths arranged in pairs to form a plurality of differential transmission lines. The planar dielectric substrate is formed to have an opening that is at least partly filled with a second dielectric material that has a second dielectric constant that is less than the first dielectric constant. The opening in the planar dielectric substrate is positioned between the conductive paths of a first of the differential transmission lines, and the size of the opening and/or the second dielectric constant is selected to increase an impedance of the first of the differential transmission lines in the vicinity of the opening.

In some embodiments, the impedance of the first of the differential transmission lines in the vicinity of the opening may be closer to a pre-selected value than it would be if the opening were filled with the first material.

DETAILED DESCRIPTION

Figure 1:
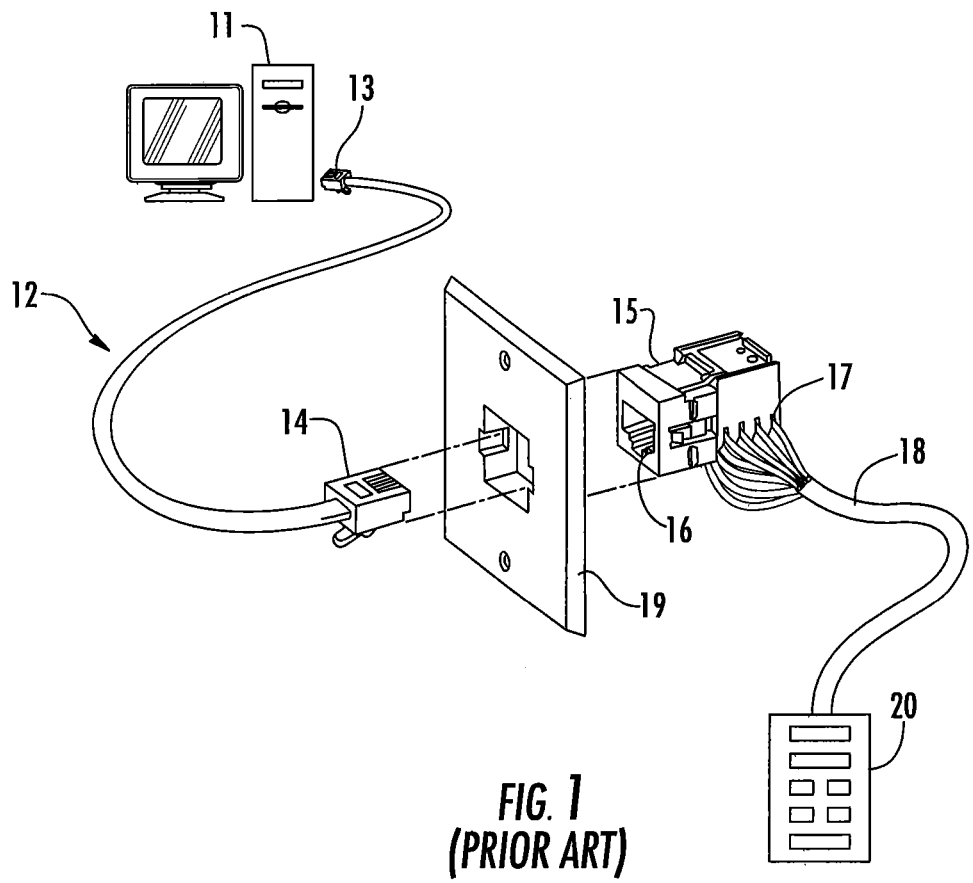
FIG. 1 is a simplified schematic diagram illustrating the use of conventional communications plugs and jacks to interconnect a computer with network equipment.

Pursuant to embodiments of the present invention, communications connectors such as communications plugs and jacks are provided that may meet crosstalk as well as return loss and insertion loss performance requirements.

As discussed above, in communications connectors that include multiple differential pairs, crosstalk is an important performance parameter that impacts the throughput (data rate) that the connector can accommodate. Another important parameter in communications connectors is the return loss that is experienced along each differential pair (i.e., differential transmission line) through the connector. The return loss of a transmission line is a measure of how well the transmission line is impedance matched with a terminating device or with loads that are inserted along the transmission line. In particular, the return loss is a measure of the signal power that is lost due to signal reflections that may occur at discontinuities (impedance mismatches) in the transmission line. Return loss is typically expressed as a ratio in decibels (dB) as follows:

$$RL\ (dB) = 10\ \log_{10}(P_i/P_r) \qquad (1)$$

where RL (dB) is the return loss in dB, $P_i$ is the incident power and $P_r$ is the reflected power. High return loss values indicate a good impedance match (i.e., little signal loss due to reflection), which is desirable. Return loss is closely related to insertion loss, which is typically expressed as a ratio in decibels (dB) as follows:

$$IL\ (dB) = 10\ \log_{10}(P_T/P_R) \qquad (2)$$

where IL (dB) is the insertion loss in dB, $P_T$ is the power transmitted to the load prior to the insertion of the connector, and $P_R$ is the power received by the load after the insertion of the connector. Low insertion loss values indicate a good impedance match (i.e., little signal loss due to insertion of the connector reflection), which is desirable.

In modern communications systems that use RJ-45 plugs and jacks, the terminating devices on each channel are typically designed to have an impedance of 100 ohms. Thus, in order to reduce or minimize the insertion loss along these channels, the differential transmission lines through the plugs, jacks, and cable segments are typically designed to have an impedance of approximately 100 ohms. The impedance of a differential transmission line can typically be set to a desired value by carefully selecting various parameters including, among other things, the width and thickness of the conductors, the separation between the conductors, the dielectric constant of the material that is between the conductors, and the distance separating the conductors from any other conductive structures such as adjacent image planes. Unfortunately, however, other design considerations may make it difficult to design communications connectors that have 100 ohm transmission lines.

For example, if a conductor of a differential transmission line inductively and/or capacitively couples with a conductor of another differential transmission line, these couplings may appear as loads on each of the differential transmission lines that change the impedance of each transmission line. As discussed above, pursuant to the relevant industry standards, RJ-45 plugs are now required to include pre-specified amounts of "offending" crosstalk between their differential transmission lines, which crosstalk appears as loads on the differential transmission lines and impacts the impedance thereof. Likewise, RJ-45 jacks are designed to include various "compensating" crosstalk circuits that may similarly impact the impedance of the differential transmission lines through these jacks. Moreover, as crosstalk increases with increasing frequency, and is generally more difficult to effectively cancel at higher frequencies, the impact of the offending and compensating crosstalk becomes more pronounced as the RJ-45 plugs and jacks are designed to operate at higher frequencies in order to support higher data rates. Thus, it may be particularly difficult to design RJ-45 plugs and jacks that operate at higher frequencies as the crosstalk, return loss and insertion loss problems may all become more difficult to address in connectors that are designed for high frequency operation such as, for example, frequencies greater than 500 MHz.

Pursuant to embodiments of the present invention, communications plugs and jacks are provided that have printed circuit boards with differential transmission lines provided thereon. These printed circuit boards may have areas where the dielectric material is removed from the printed circuit board in order to modify the impedance of one or more of the differential transmission lines. In some embodiments, the printed circuit board material may be removed to improve the impedance of the transmission line without significantly changing the geometry of the conductors of the differential transmission line, their relationship to any image planes that are provided in the printed circuit board, or their coupling to other transmission lines in the connector. As such, a designer may, for example, design a communications connector to meet various performance requirements such as crosstalk or mode conversion requirements and may then use the techniques according to embodiments of the present invention to adjust the impedance of the differential transmission line so that it exhibits acceptable return loss and insertion loss performance.

In some embodiments, the dielectric material may be removed from a region of the printed circuit board that is between the conductive paths of a differential transmission line whose impedance is to be varied. Typically, removing printed circuit board material from this location will not materially impact the coupling of the differential transmission line with other differential transmission lines, and hence will not impact the crosstalk performance of the connector, while at the same time providing a simple way to vary the differential impedance of the transmission line at issue.

In some embodiments, openings may be drilled or routed part of the way or all of the way through the dielectric substrate of the printed circuit board between the conductive paths of a differential transmission line to create air-filled openings or voids. As the dielectric constant of air ($\kappa=1.0$) is very low compared to the dielectric constant of typical printed circuit board material such as FR-4 ($\kappa\sim4.0$), the removal of the printed circuit board material increases the impedance of the differential transmission line. While air provides a convenient, easy-to-implement low dielectric constant material, it will be appreciated that in other embodiments the opening or void may be partially or completely filled with another material (i.e., a material different than air) having a low dielectric constant. It will also be appreciated that in other instances it may be necessary to decrease the impedance of a differential transmission line. This may be accomplished, for example, by drilling or routing openings in the dielectric substrate of the printed circuit board and then filling those openings with a high dielectric constant material (i.e., a material having a dielectric constant greater than the dielectric constant of the dielectric substrate of the printed circuit board).

Figure 2:
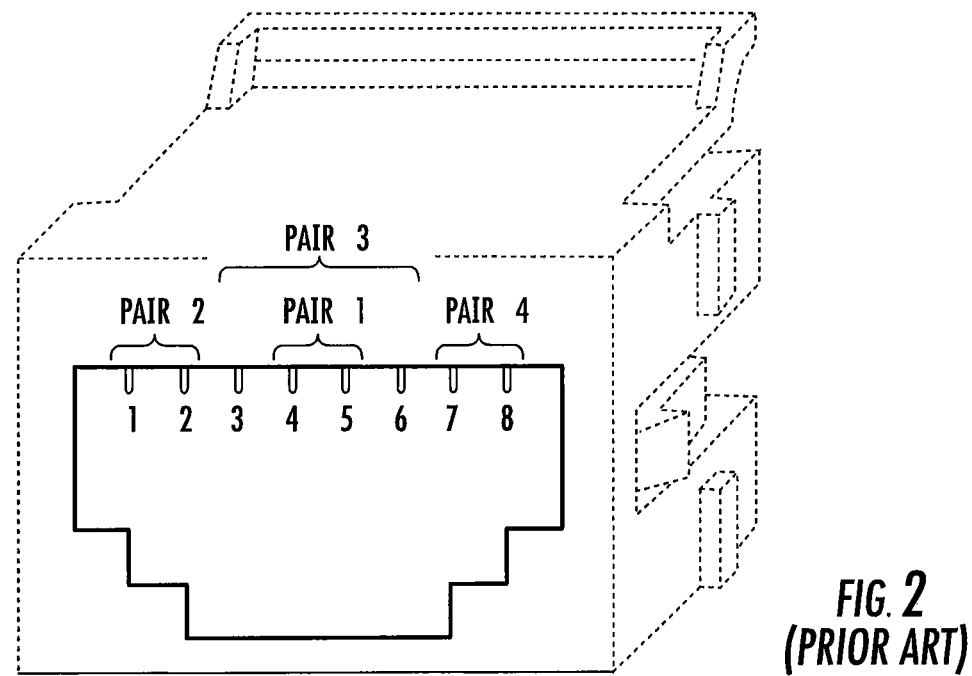
FIG. 2 is a schematic diagram illustrating the modular jack contact wiring assignments for a conventional 8-position communications jack (TIA 568B) as viewed from the front opening of the jack.

In some embodiments, the communications connector may be an RJ-45 plug or an RJ-45 jack, and the dielectric material may be removed from the printed circuit board between the conductors of differential pair 1 and/or differential pair 3 as those pairs are defined in FIG. 2 above. As noted above, these differential pairs typically have the highest amount of offending and compensating crosstalk, and hence it may be more difficult to maintain the impedance of the differential transmission lines for these pairs as compared to the "outside" pairs (pairs 2 and 4). Moreover, in some embodiments, the printed circuit board material may be removed immediately adjacent to a crosstalk circuit such as, for example, an offending crosstalk circuit in an RJ-45 plug or a compensating crosstalk circuit in an RJ-45 jack. This may facilitate modifying the impedance of the differential transmission line at the point where an external load such as a crosstalk circuit may drive the impedance of the differential transmission line away from a desired value.

Embodiments of the present invention will now be discussed in greater detail with reference to the drawings.

Figure 3:
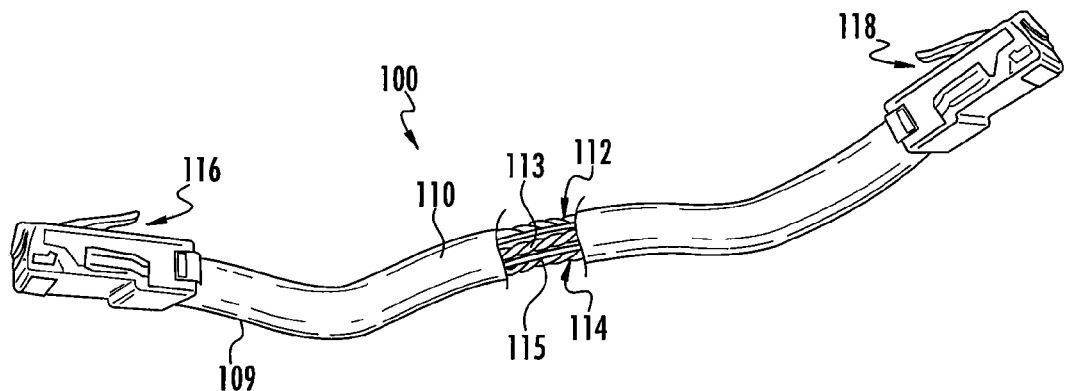
FIG. 3 is a perspective view of a patch cord according to certain embodiments of the present invention.
Figure 4:
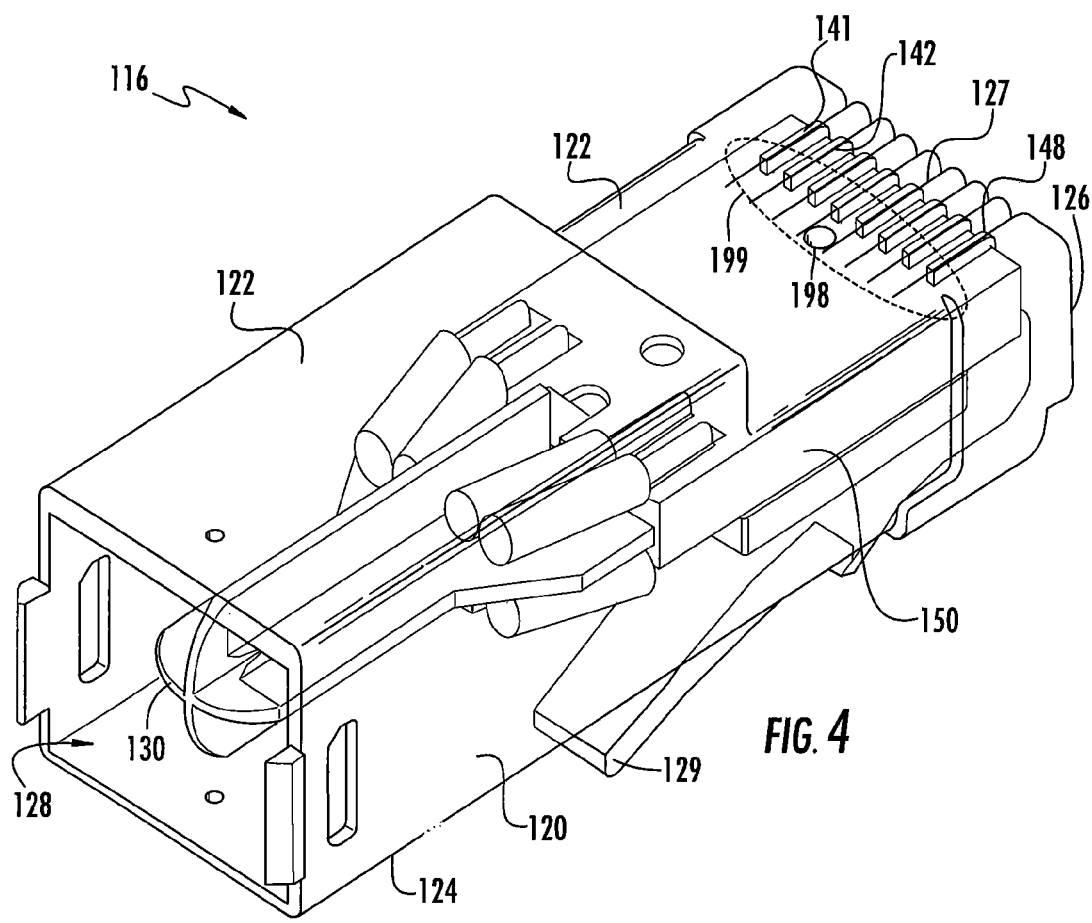
FIG. 4 is a top, rear perspective view of a plug that is included on the patch cord of FIG. 3.
Figure 5:
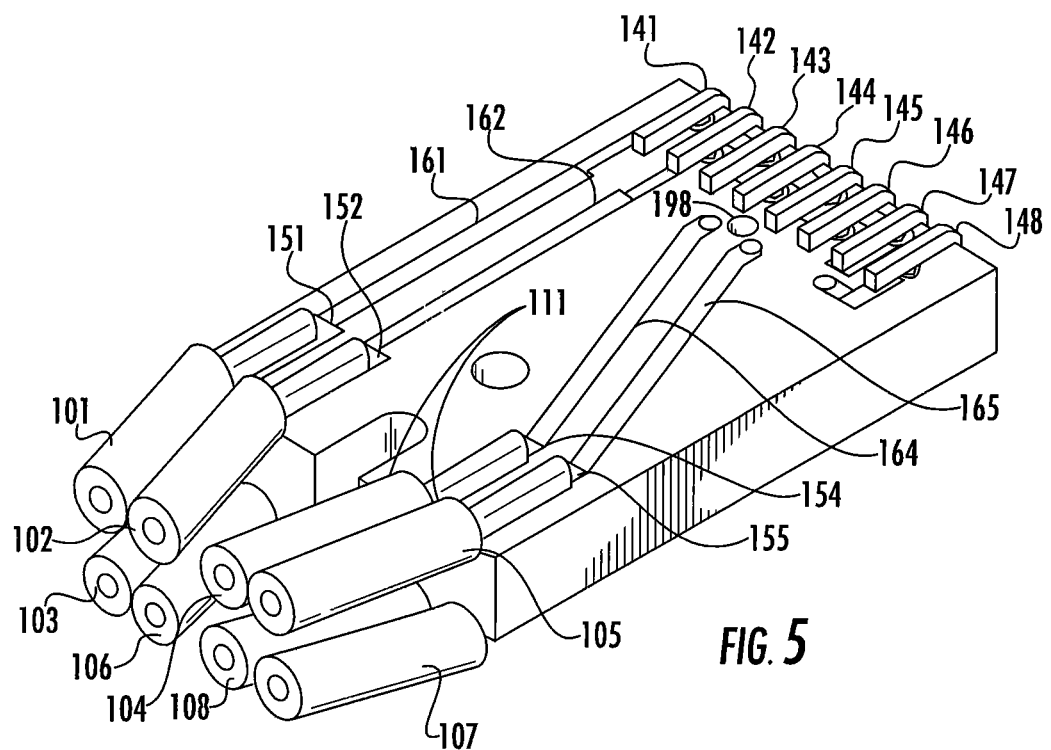
FIG. 5 is a top, rear perspective view of a printed circuit board that is included in the plug of FIG. 4.
Figure 6:
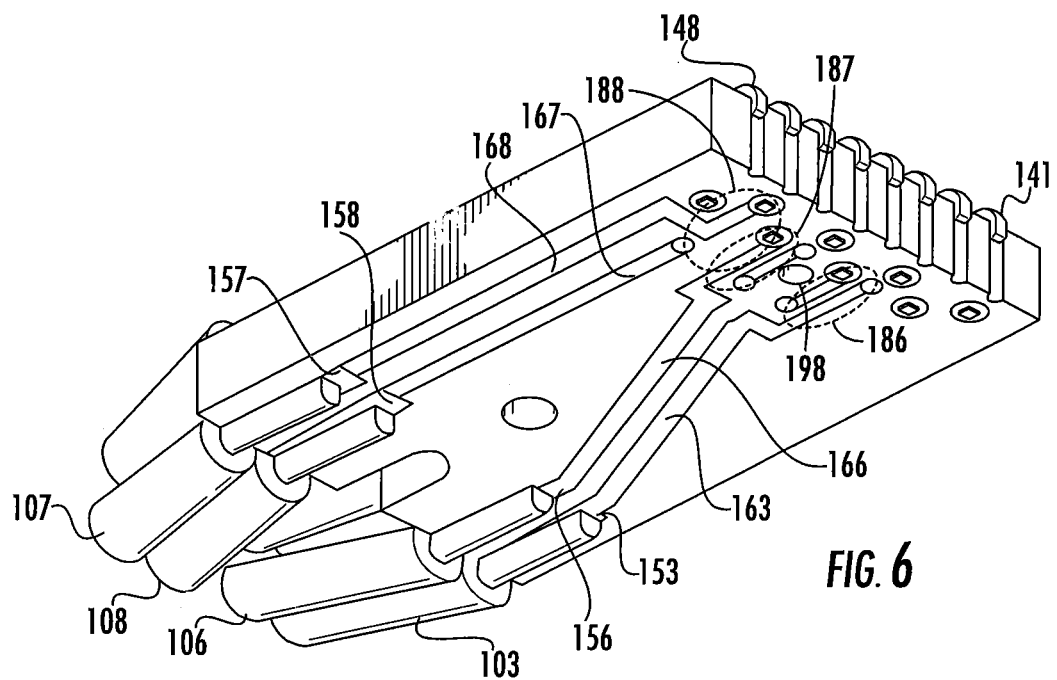
FIG. 6 is a bottom, front perspective view of the printed circuit board that is included in the plug of FIG. 4.
Figure 7:
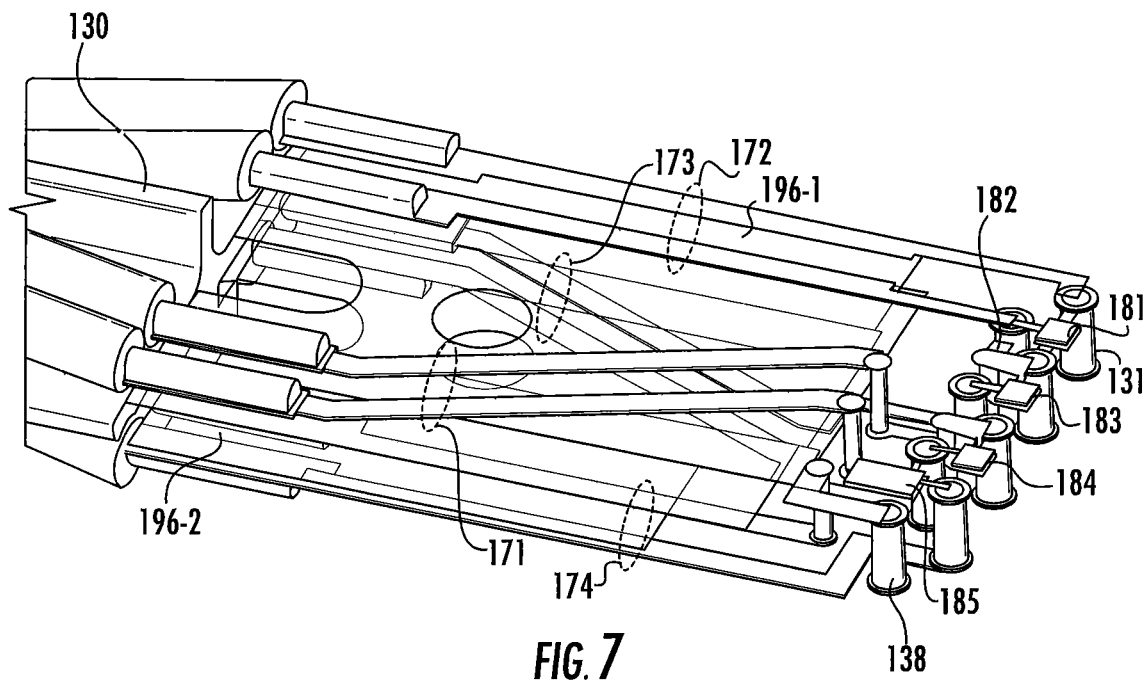
FIG. 7 is a top, side perspective view of the printed circuit board included in the plug of FIG. 4 with the dielectric substrate of the printed circuit board omitted.

FIGS. 3-7 illustrate a patch cord 100 and various components thereof according to certain embodiments of the present invention. In particular, FIG. 3 is a perspective view of the patch cord 100. FIG. 4 is a top, rear perspective view of a plug 116 that is included on the patch cord 100 of FIG. 3. FIGS. 5-7 are various perspective views of a printed circuit board 150 of the plug 116 of FIG. 4 that illustrate how the conductors 101-108 of the patch cord 100 connect to the plug blades 141-148 that are mounted on the printed circuit board 150.

As shown in FIG. 3, the patch cord 100 includes a cable 109 that has eight insulated conductors 101-108 enclosed in a jacket 110 (the conductors are not individually numbered and are not all visible in FIG. 3, but are all numbered and shown in FIG. 5). The insulated conductors 101-108 may be arranged as four twisted pairs of conductors 111-114, with conductors 104 and 105 twisted together to form twisted pair 111 (pair 111 is shown in FIG. 5), conductors 101 and 102 twisted together to form twisted pair 112, conductors 103 and 106 twisted together to form twisted pair 113, and conductors 107 and 108 twisted together to form twisted pair 114. A separator 115 such as a tape separator or a cruciform separator may be provided that separates one or more of the twisted pairs 111-114 from one or more of the other twisted pairs 111-114. A first plug 116 is attached to a first end of the cable 109 and a second plug 118 is attached to the second end of the cable 109 to form the patch cord 100.

FIG. 4 is an enlarged perspective view of the first plug 116 of the patch cord 100. In order to simplify the drawing, a rear cap of the plug housing and various wire grooming and wire retention mechanisms are not shown. As shown in FIG. 4, the communications plug 116 includes a housing 120 that has a bi-level top face 122, a bottom face 124, a front face 126, and a rear opening 128 that receives a rear cap (not shown). A plug latch 129 extends from the bottom face 124. The top and front faces 122, 126 include a plurality of longitudinally extending slots 127. The communications cable 109 (see FIG. 3) is received through the rear opening 128. The rear cap (not shown) includes a cable aperture and locks into place over the rear opening 128 of housing 120 after the communications cable 109 has been inserted therein.

The communications plug 116 further includes a printed circuit board 150 which is disposed within the housing 120, and a plurality of plug blades 141-148 that are mounted at the forward edge of the printed circuit board 150 in alignment with respective ones of the slots 127 in the housing 120. The housing 120 may be made of a suitable insulative plastic material that meets applicable standards with respect to, for example, electrical breakdown resistance and flammability.

Figure 8:
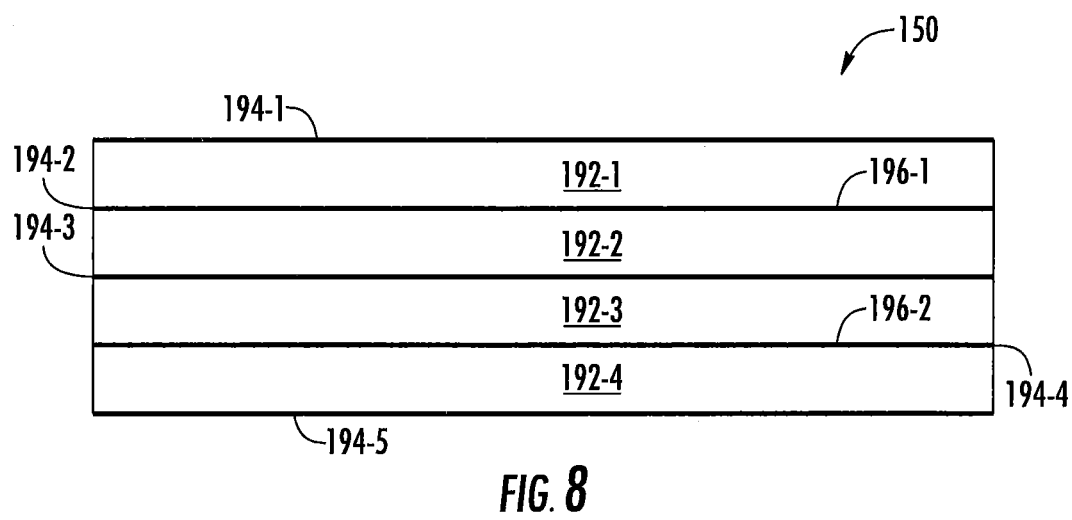
FIG. 8 is a schematic side view of the printed circuit board of FIGS. 5-7.

FIGS. 5 and 6 are enlarged perspective top and bottom views, respectively, of the printed circuit board 150 and the plug blades 141-148 that illustrate these structures in greater detail and that show how the insulated conductors 101-108 of communications cable 109 may be electrically connected to the respective plug blades 141-148 through the printed circuit board 150. FIG. 7 is an enlarged perspective top view of the printed circuit board 150 with the dielectric substrate of the printed circuit board 150 omitted to show image planes and conductive vias that extend through the dielectric substrate. FIG. 8 is a schematic side view of the printed circuit board of FIGS. 5-7.

The printed circuit board 150 may comprise, for example, a conventional printed circuit board, a specialized printed circuit board (e.g., a flexible printed circuit board) or any other appropriate type of wiring board. In the embodiment of the present invention depicted in FIGS. 4-8, the printed circuit board 150 comprises a conventional multi-layer printed circuit board that has a plurality of dielectric substrates (e.g., FR-4 substrates) having conductive materials deposited therein and conductive vias extending therethrough.

As shown in the figures, the printed circuit board 150 includes four metal pads 151-152, 154-155 on a top surface thereof and an additional four metal pads 153, 156-158 on a bottom surface thereof. The insulation is removed from an end portion of each of the conductors 101-108 of the communications cable 109, and the metal (e.g., copper) core of each conductor 101-108 may be soldered, welded or otherwise attached to a respective one of the metal pads 151-158. It will be appreciated that other techniques (e.g., insulating piercing contacts) may be used for terminating the conductors 101-108 to the printed circuit board 150. A cruciform separator 130 may be included in the rear portion of the housing 120 that separates each pair 111-114 from the other pairs 111-114 in the cable 109 to reduce crosstalk in the plug 116.

The plug blades 141-148 are configured to make mechanical and electrical contact with respective contacts, such as, for example, spring jackwire contacts, of a mating communications jack. The plug blades 141-148 are mounted in a row at the front of the printed circuit board 150. Each plug blade 141-148 includes a first section that extends longitudinally along a top surface of the printed circuit board 150, a transition section that curves through an angle of approximately ninety degrees and a second section that extends downwardly from the first section along the front edge of the printed circuit board 150. Each plug blade 141-148 also includes a base column (not shown) that extends from a bottom surface of the plug blade and is soldered or press fit within a respective one of eight metal-plated vias 131-138 that are arranged in two rows along the front edge of the printed circuit board 150 to mount the plug blades 141-148 on the printed circuit board 150.

As shown in FIGS. 5-7, a plurality of conductive paths 161-168 are provided on the top and bottom surfaces of the printed circuit board 150 that each electrically connect one of the metal pads 151-158 to a respective one of the metal-plated vias 131-138. Each conductive path 161-168 may comprise, for example, one or more conductive traces on the printed circuit board 150 and, with respect to some of the conductive paths 161-168, metal-plated or metal-filled through holes (or other layer-transferring structures) that electrically connect conductive traces on different layers of the printed circuit board 150.

The conductive paths 161-168 are arranged as four differential transmission lines 171-174. As shown in FIGS. 5-7, the two conductive traces 161-168 that form each of the differential transmission lines 171-174 are generally run together, side-by-side, on the printed circuit board 150. Running the conductive traces 161-168 of each differential transmission line 171-174 side-by-side may provide improved impedance matching so that each segment of a particular transmission line may have a relatively constant impedance. As noted above, this impedance value may be 100 ohms.

A plurality of offending crosstalk circuits 181-188 are also included on the printed circuit board 150, adjacent the plug blades 141-148. Offending crosstalk circuits 181-185 are implemented using capacitors. In particular, capacitor 181 injects offending crosstalk between plug blades 141 and 142, capacitor 182 injects offending crosstalk between blades 142 and 143, capacitor 183 injects offending crosstalk between blades 143 and 144, capacitor 184 injects offending crosstalk between blades 145 and 146, and capacitor 185 injects offending crosstalk between blades 146 and 147. Additionally, a first inductive coupling section 186 is provided between conductive paths 163 and 164, and a second inductive coupling section 187 is provided between conductive paths 165 and 166. A third inductive coupling section 188 is included between conductive traces 166 and 167. The offending crosstalk circuits 181-188 may be provided, for example, to ensure that the plug 116 meets all of the pair-to-pair offending crosstalk specifications required by an industry standards document such as the aforementioned ANSI/TIA-568-C.2 standard. As discussed above, these offending crosstalk circuits 181-188 appear as loads along the transmission lines 171-174 and hence may make it difficult for the plug 116 to meet target return loss performance specifications, particularly at higher frequencies (e.g., frequencies above 500 MHz and even more so with respect to frequencies above 1 Ghz or above 1.5 GHz).

FIG. 8 is a schematic side view of the printed circuit board 150. As shown in FIG. 8, the printed circuit board 150 may comprise one or more dielectric layers 192 and a plurality of conductive "layers" 194. In the depicted embodiment, the printed circuit board 150 includes four dielectric layers 192-1 through 192-4 that are arranged in a stacked relationship and laminated or otherwise joined together to provide a unitary structure. Conductive material such as conductive traces, metal pads, and image planes may be deposited on the top and/or bottom faces of one or more of the dielectric layers 192 to form five conductive layers 194-1 through 194-5. In the depicted embodiment, conductive layers 194-1 and 194-5 include conductive pads 151-158, the conductive traces 161-168, and some crosstalk compensation structures (e.g., capacitor plates). Conductive layers 194-2 through 194-4 include respective reflection or "image" planes 196-1, 196-2 that are each implemented as a sheet of conductive material that is deposited on, for example, the bottom face of dielectric layer 192-2 (image plane 196-1) and the top face of dielectric layer 192-4 (image plane 196-2), as well as additional crosstalk compensation structures. The image planes 196 may be grounded by, for example, connecting each image plane 196 to a ground wire, drain wire or may not be electrically grounded (i.e., they are left floating electrically). The image planes 196, whether or not they are electrically grounded, may act as shielding structures that reduce coupling between the portions of conductive traces 161-168 that are on the top side of the printed circuit board 150 and the portions of conductive traces 161-168 that are on the bottom side of the printed circuit board 150. The image planes 196 may also be used to control the impedance of the transmission lines 171-174, as the impedance of each differential transmission line is impacted by the distance of the conductors of the transmission line 171-174 from the image plane(s) 196.

As is shown in FIGS. 4-6, one or more openings 198 may be formed in the dielectric substrates 192. In some embodiments, the opening(s) 198 may comprise hole(s) that have been drilled, punched, routed or the like through all four dielectric substrates 192 (i.e., the openings 198 extend from the top surface to the bottom surface of the printed circuit board 150). In other embodiments, the openings 198 may comprise recesses in the printed circuit board 150 such as trenches routed in a surface of the printed circuit board 150. The recesses 198 may extend part or all of the way through one or more of the dielectric substrates 192. In still other embodiments, the openings 198 may be in the interior of the printed circuit board 150 such as, for example, trenches or holes that are formed in the interior dielectric substrates 192-2, 192-3. The openings 198 may also be formed during the manufacture of the dielectric substrates 192 instead of by mechanically drilling or routing the openings 198 out of the dielectric substrates 152.

In the depicted embodiment, the openings 198 are left open, and hence are filled only with air. Air has a dielectric constant of 1.0. The dielectric substrates 192 may be formed of any appropriate material such as, for example, FR-4, which is commonly used to form the dielectric substrate(s) of conventional printed circuit boards. FR-4 has a dielectric constant of about 4.0.

As shown best in FIG. 6, in the depicted embodiment a single opening 198 is provided in the printed circuit board 150. The opening 198 comprises an oblong hole that extends through all four dielectric substrates 192 of printed circuit board 150. This hole 198 is positioned between the segments of conductive paths 164 and 165 that attach to the metal-plated vias 134, 135 that hold the plug blades 144, 145. Thus, the hole 198 is between the two conductive paths that form differential transmission line 171-1 in a region of printed circuit board 150 that is labeled 199 in FIG. 4.

If the hole 198 were not provided in printed circuit board 150, then the impedance of differential transmission line 171-1 in the region 199 would have a first value that would depend, among other things, on the widths, thicknesses and separation of the conductive paths 164, 165 in region 199, the separation between the conductive paths 164, 165 in region 199 and the overlying image plane 196-1, the dielectric constant of the dielectric substrates 192, and inductive and capacitive loading on the conductive paths 164, 165 in region 199 from other adjacent conductive structures such as the inductive offending crosstalk circuits 186, 187. By providing the air-filled hole 198 through the printed circuit board 150, the effective dielectric constant between the conductive paths 164, 165 in region 199 is substantially reduced, which reduces the coupling between the conductive paths 164, 165, thereby increasing the differential impedance of transmission line 171-1 in region 199.

Typically, in modern communications systems that use RJ-45 plugs and jacks each differential transmission line in the communications connector is designed to have a differential impedance of 100 ohms, to the extent possible. The differential transmission lines extend from a plurality of input contacts of the connector (e.g., the plug blades 141-148) and the output contacts of the connector (e.g., the metal pads 151-158). It typically is fairly easy to meet this design goal throughout most of each differential transmission line, as it typically is possible to space the differential transmission lines sufficiently apart from each other such that there is not significant coupling between them. The conductors of each differential transmission line may then be spaced apart an appropriate difference, formed of an appropriate width, etc. so that each differential transmission line will have a differential impedance of approximately 100 ohms.

Unfortunately, however, as RJ-45 plug and jack connectors are required to operate at higher and higher frequencies, it may become more difficult to maintain each differential transmission line at 100 ohms differential impedance throughout the entire connector. For example, in the plug blade region of an RJ-45 plug, one or more offending crosstalk circuits may be provided. These crosstalk circuits are typically located as close as possible (in terms of the electrical delay) to the regions of the plug blades that mate with the contacts of a mating communications jack. This region of the plug may be very crowded due to the close-spacing of the plug blades required by the industry standards, the need for the conductors of pair 3 to split apart at the plug blades, the offending crosstalk circuits, and the mounting structures (e.g., posts and conductive vias) that are used to mount the plug blades on the printed circuit board. Moreover, as noted above, the offending crosstalk circuits place loads on the differential transmission lines that will impact their differential impedance. As a result, it may be a difficult design challenge to maintain the impedance of the differential transmission lines near 100 ohms in region 199 of plug 116.

Typically, the industry standards specify minimum return loss and/or insertion loss performance requirements (which are typically specified as a function of frequency) for each of the differential transmission lines. If a differential transmission line does not meet these requirements, then it may be necessary to reroute the transmission lines, relocate the offending crosstalk circuits or make other changes. This can require significant work, and may often necessitate moving one or more of the offending crosstalk circuits farther from the plug jack mating point. This may degrade the crosstalk performance of the connector.

The openings 198 may provide a simple way of modifying the impedance of the differential transmission lines through a communications connector such as a communications plug. For example, if a segment of a differential transmission line across a printed circuit board having an FR-4 dielectric substrate has an impedance of less than 100 ohms, then removing a portion of the printed circuit board between the conductive paths of the differential transmission line will reduce the capacitive and inductive coupling between the conductive paths, and hence will increase the differential impedance of the transmission line. Moreover, removing a portion of the printed circuit board typically will not impact the impedance of other differential transmission lines or the amount of coupling provided by the various offending crosstalk circuits. Thus, improved return loss and insertion loss performance may be obtained without impacting the crosstalk performance of the connector.

In some embodiments, the openings 198 may comprise air-filled openings. In other embodiments, the openings 198 may be filled with low-dielectric materials such as, for example, expanded PTFE. In some embodiments, the openings 198 may extend all the way through the printed circuit board 150. In other embodiments, the openings 198 may be formed in a surface of the printed circuit board 150 but may not extend all the way through the printed circuit board 150. In such embodiments, the opening 198 will typically be provided on the side of the printed circuit board 150 that has the conductive traces of the differential transmission line whose impedance needs to be adjusted.

In some situations, the impedance of a differential transmission line may need to be reduced. In this situation, the openings 198 may be filled with a high dielectric constant material such as, for example, alumina, that has a higher dielectric constant than the dielectric constant of the dielectric substrate of the printed circuit board 150.

The openings 198 may be positioned on the printed circuit board adjacent the portion of a differential transmission line 171-174 which has an impedance that varies from a desired value such as 100 ohms. The opening 198 will typically be positioned between the conductive paths of the differential transmission line 171-174 at issue. The opening 198 may often be positioned adjacent to a crosstalk circuit 181-188 on the printed circuit board 150, as the crosstalk circuits 181-188 impart a load on the differential transmission lines 171-174 that may impact the impedance thereof. The opening 198 may be particularly effective in counter-acting the effects of an inductive crosstalk circuit 186-188, as the inductive crosstalk circuits 186-188 spread the load out over the distance that the traces inductively couple, and the opening 198 likewise spreads out the effect on the impedance of the differential transmission line 171-174 over the length of the opening 198.

While FIGS. 4-8 illustrate a communications plug that has a printed circuit board with openings therein that are used to adjust the impedance of one or more sections of the differential transmission lines, it will be appreciated that these techniques may be used in other types of communications connectors. For example, FIGS. 9-10 illustrate a communications jack according to embodiments of the present invention that has a printed circuit board with an opening therein that is used to adjust the differential impedance of a transmission line that traverses the printed circuit board.

Figure 9:
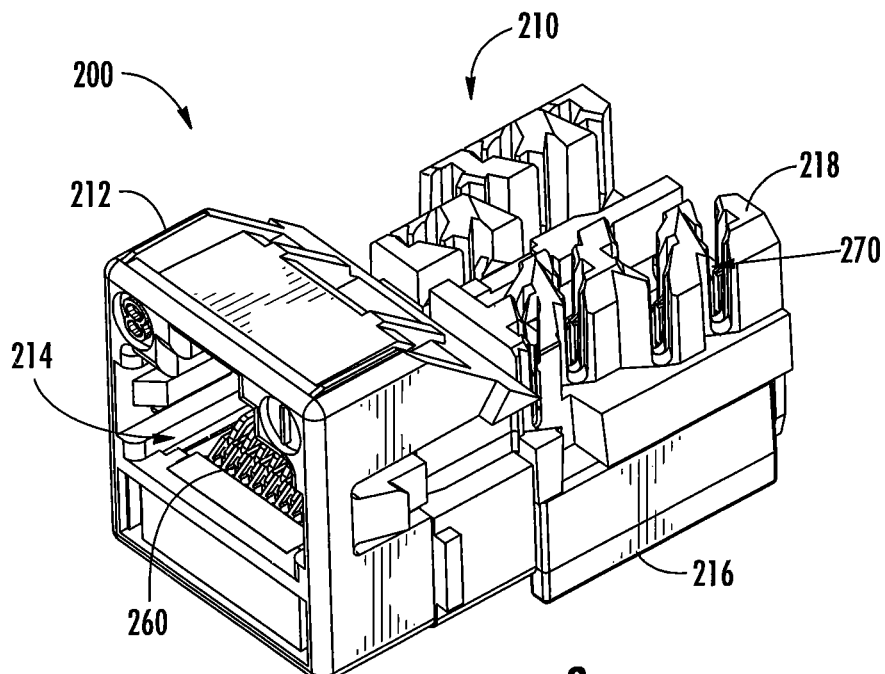
FIG. 9 is a perspective view of a jack according to embodiments of the present invention.

As shown in FIG. 9, the communications jack 200 includes a housing 210 having a plug aperture 214. In the depicted embodiment, a three-part housing 210 is used that includes a jackframe 212, a cover 216 and a terminal housing 218. It will be appreciated, however, that any suitable housing may be used. A printed circuit board 220 (see FIG. 10) is mounted within the housing 210. A plurality of jack contacts 260 extend into the plug aperture 214. The jack contacts 260 may comprise, for example, conventional cantilevered jackwire contacts formed of a resilient metal such as beryllium copper or phosphor bronze, or may be non-conventional jackwire contacts such as non-resilient metal contacts, contacts formed using traces or pads on a flexible printed circuit board, resilient metal contacts that have two free ends, etc. The jack 200 also includes a plurality of output contacts which, in the depicted embodiment, comprise a plurality of insulation displacement contacts ("IDCs") 270 that are mounted within the terminal housing 218.

Figure 10:
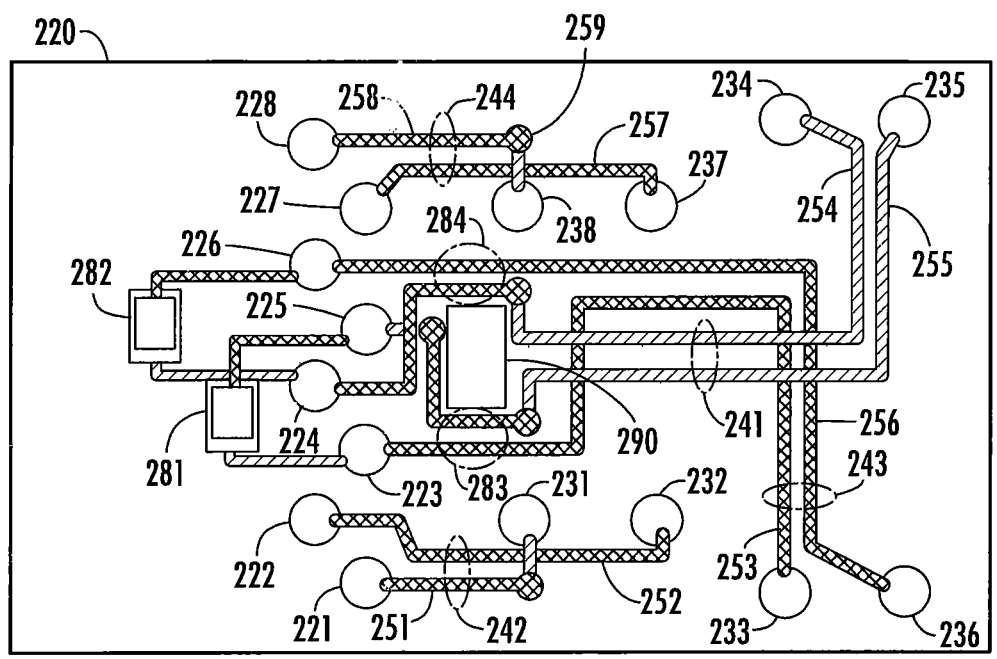
FIG. 10 is a top view of a printed circuit board of the jack of FIG. 9.

FIG. 10 is a simplified top view of a printed circuit board 220 of the jack 200. As shown in FIG. 10, the printed circuit board 220 may comprise a conventional printed circuit board that includes one or more dielectric substrates (e.g., FR-4 substrates) that have metal deposited on one or both faces thereof. If multiple dielectric substrates are provided, the dielectric substrates may be laminated together to form a unitary printed circuit board 220. Each jackwire contact 260 may have a fixed end that is mounted in a respective one of a first plurality of metal-plated vias 221-228 so as to extend into the plug aperture 214. Each IDC 270 may be mounted in a respective one of a second plurality of metal-plated vias 231-238. A plurality of conductive traces may be deposited on, for example, the top and bottom faces of the printed circuit board 220. These conductive traces may form eight conductive paths 251-258 that each connect a respective one of the metal-plated vias 221-228 to a respective one of the metal-plated vias 231-238. Metal-filled vias 259 are provided that electrically connect conductive traces of a conductive path that are on different faces of the printed circuit board 220.

As is further shown in FIG. 10, the conductive paths 251-258 are arranged as four differential transmission lines 241-244. In particular, conductive paths 254, 255 form a first differential transmission line 241, conductive paths 251, 252 form a second differential transmission line 242, conductive paths 253, 256 form a third differential transmission line 243, and conductive paths 257, 258 form a fourth differential transmission line 244. For the most part, the two conductive paths of each differential transmission line 241-244 are routed across the printed circuit board 220 so that they are at a constant distance from each other. Typically, this constant distance is selected so that the differential transmission line will have an impedance of approximately 100 ohms.

As can be seen in FIG. 10, the metal-plated vias 221-228 and 231-238 are typically arranged in staggered fashion in order to reduce crosstalk between the differential pairs. Because of these staggered arrangements, it often is not possible to have the two conductive paths for a differential transmission line 241-244 be spaced apart from each other at a constant distance in the vicinity of the metal-plated vias 221-228 or the metal-plated vias 231-238. This can cause variations from the desired impedance value of 100 ohms in the vicinity of the metal-plated vias. Additionally, because of the standardized arrangement for the jackwire contacts that is illustrated in FIG. 2 above, the metal-plated vias 233, 236 for pair 3 are typically spread apart with the metal-plated vias 234, 235 for pair 1 disposed therebetween, as is shown in FIG. 10. Consequently, the conductive paths 253, 256 tend to be split widely apart in the vicinity of the metal-plated vias 231-238. This may cause even larger variations in the differential impedance of differential transmission line 243.

As is also shown in FIG. 10, compensating crosstalk circuits such as the capacitors 281, 282 and the inductive coupling trace sections 283, 284 may also be provided on the printed circuit board 220 that inject compensating crosstalk onto various of the differential transmission lines 241-244. The compensating crosstalk circuits 281-284 are typically provided at short delays from the conductive vias 221-228 in order to inject the compensating crosstalk as close to the location where the offending crosstalk is injected in a mated plug jack connection. As discussed above, the compensating crosstalk circuits 281-284 appear as loads on the differential transmission lines 241-244 that impact the impedance thereof. Moreover, the inductive compensating crosstalk circuits 283, 284 are typically formed by crossing the conductive paths 254 and 255 one or two times, which results in a section along these conductive paths where the conductive traces are not maintained at a constant separation that is selected to achieve a desired impedance value. As a result, it may be difficult to design each of the differential transmission lines 241-244 to have an impedance of approximately 100 ohms in the region of the printed circuit board 220 close to the metal-plated vias 221-228.

As shown in FIG. 10, an opening 290 is provided in the printed circuit board 220 between conductive traces 254 and 255. In the depicted embodiment, the opening 290 comprises a trench that is routed part of the way through the printed circuit board 220, but not all of the way through. For example, if the printed circuit board 220 includes a total of four dielectric substrates that are laminated together, the trench 290 may comprise a hole that is formed through the top two dielectric substrates. The trench 290 may be filled with an insulative material that has a dielectric constant that is different from the dielectric constant of the dielectric substrates. In some embodiments, this material may be air. In other embodiments, the material may be a low dielectric constant material. In still other embodiments, the material may be a high dielectric constant material.

The size, shape and depth of the trench 290, as well as the dielectric constant of the material that is filled within the trench 290, may be selected to change the impedance of one or more of the differential transmission lines 241-244 in a desired fashion. For example, in some embodiments, the loading by the crosstalk circuits 281-284 may drive the impedance of differential transmission line 241 well below 100 ohms in the vicinity of the metal-plated vias 224, 225. In such embodiments, the opening 290 may comprise an air-filled opening that reduces the effective dielectric constant of the region between conductive paths 254, 255, thereby increasing the differential impedance thereof.

Notably, the trench 290 does not materially impact the coupling that occurs in any of the crosstalk compensation circuits 281-284, as the trench 290 is positioned between the conductive paths 254, 255 and hence does not materially impact the coupling between conductive traces 254 and 256 or the coupling between conductive traces 253 and 255 in any of the crosstalk compensation circuits 281-284. While the trench 290 does increase the differential impedance of differential transmission line 243 (as it is also between the conductive paths 253, 256 of this differential transmission line), the effect on differential transmission line 243 is much smaller, given that the physical separation of conductive paths 253 and 256 in this region of the printed circuit board 220 was already large such that the coupling was already quite low. The impact of trench 290 on the impedance of differential transmission line 243 may be positive or negative depending upon the design of the jack 200.

The openings that are provided in the printed circuit boards of the communications plugs and jacks according to embodiments of the present invention may be provided between the two conductive paths of a differential transmission line. This positioning of the openings may have a significant effect on the impedance of the differential transmission line at issue without materially impacting the impedance of other differential transmission lines or the coupling levels of any crosstalk circuits on the printed circuit board.

As communications plugs and jacks are designed to operate at higher frequencies (e.g., at frequencies above 500 MHz), it may become increasingly difficult to keep crosstalk at acceptable levels. Consequently, the plug and jack designs may be driven by crosstalk considerations. If the resulting plug and jack designs fail to achieve acceptable return loss and/or insertion loss values, then it may be necessary to modify the printed circuit board design to improve insertion loss or return loss performance. However, as this is typically accomplished by modifying the spacings and/or thicknesses of one or more of the conductive traces, this also tends to impact the crosstalk coupling, typically in a negative fashion. Thus, it may be a difficult process to design a connector that simultaneously provides acceptable crosstalk, return loss and insertion loss performance. The techniques according to embodiments of the present invention, however, can often substantially decouple crosstalk from insertion loss and return loss, allowing a designer to individually optimize the performance of each.

Pursuant to further embodiments of the present invention, methods of manufacturing a printed circuit board for a communications connector are provided in which a plurality of input terminals, a plurality of output terminals and a plurality of conductive paths are formed on a planar dielectric substrate. The planar dielectric substrate may comprise, for example, FR-4, which has a dielectric constant of about 4.0. The planar dielectric substrate may be formed from a single piece of material or may comprise multiple dielectric substrates that are laminated together to form a unitary structure. The input terminals may comprise, for example, conductive vias that have jackwire contacts mounted therein. The output terminals may comprise, for example, conductive vias that have IDCs mounted therein or conductive pads that the conductors of a communications cable are soldered to. Each of the conductive paths may electrically connect a respective one of the input terminals to a respective one of the output terminals. The conductive paths may be formed as a conductive trace that is on a single layer of the dielectric substrate or may include conductive traces on multiple layers of the dielectric substrate that are electrically connected via, for example, metal plugs.

The conductive paths are arranged in pairs to form a plurality of differential transmission lines across the dielectric substrate. Moreover, the planar dielectric substrate is formed to have an opening therein. The opening may be formed by removing a portion of the planar dielectric substrate by, for example, drilling hole(s) through one or more of the layers thereof or by mechanically routing away some of the dielectric substrate. In other embodiments, the dielectric substrate may be pre-formed to have the opening therein (e.g., molded to have the opening). The opening may be filled with one or more materials. Most typically, the opening will be an air-filled opening. However, in some embodiments, the opening may be partly or completely filled with a material (or multiple materials) other than air. The material(s) in the opening have an effective dielectric constant that is different from the dielectric constant of the dielectric substrate.

As discussed above, the opening in the planar dielectric substrate may be positioned between the conductive paths of a first of the differential transmission lines. The size of the opening and/or the second dielectric constant may be selected to change an impedance of the first of the differential transmission lines in the vicinity of the opening so that it is closer to a pre-selected value than it would otherwise be if the opening were not provided and the area of the opening was replaced with the dielectric substrate. The pre-selected value may be, for example, 100 ohms. It should be noted that replacing the original dielectric substrate with an opening filled with a material having a different dielectric constant may not bring the impedance of the differential transmission line to the pre-selected value; however, so long as provision of the opening brings the impedance closer to the pre-selected value than it would otherwise be the provision of the opening may provide a communications connector that exhibits improved performance.

Pursuant to further embodiments of the present invention, communications connectors may be provided that include printed circuit boards having openings therein that are used to adjust the capacitive coupling between two differential transmission lines without significantly impacting either the impedance of the differential transmission lines or the inductive coupling between the differential transmission lines. This technique may be used, for example, when a connector design has approximately the correct amount of inductive coupling between two differential transmission lines and approximately a desired impedance on the two differential transmission lines, but has either too much or too little capacitive coupling between the two differential transmission lines.

Figure 11:
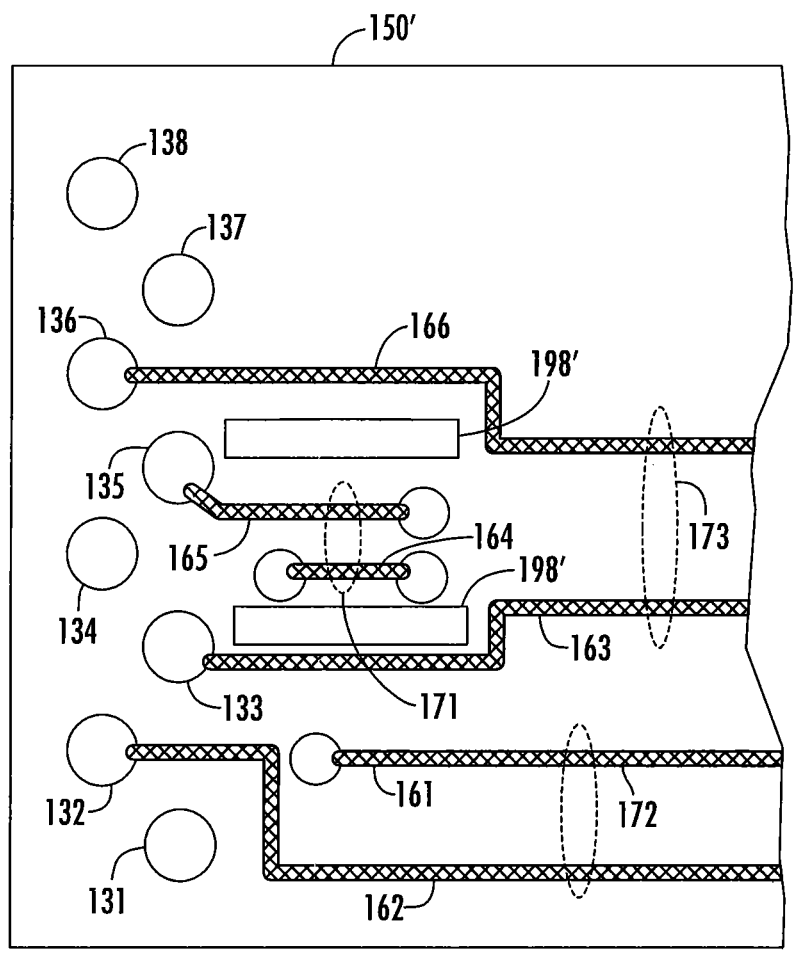
FIG. 11 is a partial bottom top view of an alternative embodiment of a printed circuit board that may be used in the plug of FIG. 4.

FIG. 11 is a partial bottom top view of an alternative embodiment of a printed circuit board 150' according to an example implementation of this embodiment of the present invention. The printed circuit board 150' may be used in the plug of FIG. 4.

As shown in FIG. 11, a plurality of conductive paths 161-168 are provided on printed circuit board 150' (conductive traces 167 and 168 are not visible in FIG. 11), at least some of which include sections on the bottom surface of the printed circuit board 150', that each electrically connect one of a plurality of metal pads 151-158 (not shown in FIG. 11) to a respective one of a plurality of metal-plated vias 131-138. The conductive paths 161-168 are arranged as four differential transmission lines 171-174 (differential transmission line 173 is not visible in FIG. 11). As shown in FIG.

11, on the bottom surface of the printed, circuit board 150', the two conductive traces 164 and 165 that form differential transmission line 171 are positioned in between the two conductive traces 163 and 166 that are part of differential transmission line 173 in the region of printed circuit board 150' near the vias 131-138.

As is further shown in FIG. 11, a pair of openings 198' are provided through the printed circuit board 150'. Instead of being positioned between the conductive traces 164 and 165 like the opening 198 in the embodiment of FIGS. 4-8, the openings 198' are positioned between conductive traces 163 and 164 and between conductive traces 165 and 166. As a result, the openings 198' will not significantly impact the differential impedance of either differential transmission line 171 or 173. The openings 198' likewise will not significantly impact the inductive coupling between differential transmission lines 171 and 173. However, if the dielectric constant of the material in the openings 198' (e.g., air or a filling material) differs from the dielectric constant of the dielectric substrate of the printed circuit board 150', then the openings 198' will affect the capacitive coupling between differential transmission lines 171 and 173. Thus, it will be appreciated that according to further embodiments of the present invention openings may be provided in a printed circuit board in order to either increase of decrease the capacitive coupling between a pair of differential transmission lines without significantly impacting either the impedance of each transmission line or the inductive coupling between the differential transmission lines.

While the discussion above focuses on communications connectors that include differential transmission lines, it will also be appreciated that similar openings could be provided in printed circuit boards of communications connectors that include single-ended transmission lines. In such embodiments, the above-discussed air-filled openings could be used to reduce the capacitive coupling between adjacent single-ended transmission lines without significantly impacting the impedance of the transmission lines or the inductive coupling between the transmission lines. It will also be appreciated that instead of air-filled openings, openings could be provided in the printed circuit board between the single-ended transmission lines that are filled with either low dielectric constant or high dielectric constant material depending upon whether or not more or less capacitive coupling is desired and the specific amount of capacitive coupling desired.

In the discussion herein, it will be appreciated that references to the "impedance" of a differential transmission line refer to the differential impedance of the transmission line.

Reference is made herein to printed circuit boards that have input terminals, output terminals and conductive paths "on" a dielectric substrate. It will be appreciated that the input terminals, output terminals and conductive paths may be metal that is plated on an exterior surface of the dielectric substrate, or can be, for example, metal-plated vias or metal plugs that extend through the dielectric substrate. In each case, these structures are considered to be "on" the dielectric substrate.

Pursuant to embodiments of the present invention, techniques are disclosed for improving the return loss performance of communications connectors, particularly at higher frequencies (e.g., frequencies above 500 MHz), as well as communications connectors that exhibit such improved return loss performance. The techniques according to embodiments of the present invention may be particularly suitable for use in Category 8 connectors that maintain backwards compatibility with the Category 6a standard, as the amount of offending crosstalk compensating crosstalk that is typically included in Category 6a standards-compliant connectors may appear as loads on the transmission lines through the connectors that can make it difficult to maintain good return loss performance at higher frequencies.

The present invention is not limited to the illustrated embodiments discussed above; rather, these embodiments are intended to fully and completely disclose the invention to those skilled in this art. In the drawings, like numbers refer to like elements throughout. Thicknesses and dimensions of some components may be exaggerated for clarity.

Spatially relative terms, such as "top," "bottom," "side," "upper," "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, integers, steps, operations, elements, and/or components, but do not preclude the presence or addition of one or more other features, integers, steps, operations, elements, components, and/or groups thereof. As used herein the expression "and/or" includes any and all combinations of one or more of the associated listed items.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A communications connector, comprising:
   first through fourth pairs of input contacts;
   first through fourth pairs of wire connection contacts;
   a printed circuit board that comprises a dielectric substrate formed of a first dielectric material that has a first dielectric constant and first through fourth differential transmission lines that electrically connect the first through fourth pairs of input contacts to the respective first through fourth pairs of wire connection contacts;
   wherein the printed circuit board includes a first opening that is positioned between a first conductive path of the first differential transmission line and a first conductive path of the third differential transmission line, and a second opening that is positioned between a second conductive path of the first differential transmission line and a second conductive path of the third differential transmission line, and wherein the first opening is filled with a second dielectric material having a second dielectric constant that is different from the first dielectric constant and the second opening is filled with a third dielectric material having a third dielectric constant that is different from the first dielectric constant.

2. The communications connector of claim 1, wherein the first and second conductive paths of the first differential transmission line are routed between the first and second openings.

3. The communications connector of claim 1, wherein the second and third dielectric materials comprise air.

4. The communications connector of claim 1, wherein the first pair of input contacts are between the third pair of input contacts.

5. The communications connector of claim 1, wherein the communications connector comprises an RJ-45 plug.

6. The communications connector of claim 1, wherein the second dielectric constant is less than the first dielectric constant and wherein the third dielectric constant is less than the first dielectric constant.

7. The communications connector of claim 1, wherein the printed circuit board comprises a multi-layer printed circuit board, and wherein the first and second openings each extend all of the way through the printed circuit board.

8. The communications connector of claim 1, wherein the printed circuit board includes at least one conductive via that is between the first and second openings.

9. The communications connector of claim 1, wherein input contacts comprise plug blades and the wire connection contacts comprise solder pads on the printed circuit board.

10. A communications connector, comprising:
first through fourth pairs of input contacts;
first through fourth pairs of wire connection contacts;
a printed circuit board that comprises a dielectric substrate formed of a first dielectric material that has a first dielectric constant and first through fourth differential transmission lines that electrically connect the first through fourth pairs of input contacts to the respective first through fourth pairs of wire connection contacts;

wherein the printed circuit board includes a first inductive crosstalk circuit where a first conductive path of the first differential transmission line is routed immediately adjacent a first conductive path of the third differential transmission line, and wherein the printed circuit board includes an opening that is filled with a second dielectric material having a second dielectric constant that is different from the first dielectric constant, the opening being immediately adjacent the first inductive crosstalk circuit.

11. The communications connector of claim 10, wherein the second dielectric constant is less than the first dielectric constant.

12. The communications connector of claim 10, wherein the printed circuit board further includes a second inductive crosstalk circuit where a second conductive path of the first differential transmission line is routed immediately adjacent a second conductive path of the third differential transmission line, and wherein the opening is between the first and second inductive crosstalk circuits.

13. The communications connector of claim 12, wherein the first and second inductive crosstalk circuits each, inject offending inductive crosstalk between the first and third differential transmission lines.

14. The communications connector of claim 12, wherein the input contacts comprise plug blades and the opening is immediately adjacent the plug blades.

15. The communications connector of claim 12, wherein the first pair of input contacts are between the third pair of input contacts.

16. The communications connector of claim 12, wherein the opening comprises an oblong opening that extends all the way through the printed circuit board, and wherein the second dielectric material is air.

* * * * *

UNITED STATES PATENT AND TRADEMARK OFFICE
CERTIFICATE OF CORRECTION

PATENT NO. : 9,537,262 B2  
APPLICATION NO. : 15/162875  
DATED : January 3, 2017  
INVENTOR(S) : Schumacher Page 1 of 1

It is certified that error appears in the above-identified patent and that said Letters Patent is hereby corrected as shown below:

In the Specification
Column 5, Line 65: Please correct "RL (dB)=10 $\log_{10}(P_i/P_d)$" to read -- RL (dB)=10 $\log_{10}(P_i/P_r)$ --

In the Claims
Column 20, Claim 13, Line 26: Please correct "each," to read -- each --

Signed and Sealed this
Thirteenth Day of June, 2017

Joseph Matal
*Performing the Functions and Duties of the*
*Under Secretary of Commerce for Intellectual Property and*
*Director of the United States Patent and Trademark Office*